United States Patent [19]
Bryant et al.

[11] Patent Number: 5,736,433
[45] Date of Patent: Apr. 7, 1998

[54] DOUBLE MASK HERMETIC PASSIVATION METHOD PROVIDING ENHANCED RESISTANCE TO MOISTURE

[75] Inventors: Frank R. Bryant, Denton; Abha R. Singh, Garland, both of Tex.; James A. Cunningham, Saratoga, Calif.

[73] Assignee: SGS-Thomson Microelectronics, Inc., Carrollton, Tex.

[21] Appl. No.: 778,021

[22] Filed: Dec. 31, 1996

Related U.S. Application Data

[60] Continuation-in-part of Ser. No. 738,738, Oct. 28, 1996, which is a division of Ser. No. 651,618, May 22, 1996.

[51] Int. Cl.$^6$ .................................................. H01L 21/70
[52] U.S. Cl. .................................................. 438/130; 438/132
[58] Field of Search ............................... 438/130, 132

[56] References Cited

U.S. PATENT DOCUMENTS

| | | | |
|---|---|---|---|
| 4,536,949 | 8/1985 | Takayama et al. | 437/922 |
| 4,628,590 | 12/1986 | Udo et al. | 437/922 |
| 4,795,720 | 1/1989 | Kawanabe et al. | 437/922 |
| 5,017,510 | 5/1991 | Welch et al. | 437/922 |
| 5,025,300 | 6/1991 | Billig et al. | 257/529 |
| 5,235,205 | 8/1993 | Lippitt, III | 257/529 |
| 5,252,844 | 10/1993 | Takagi | 257/296 |
| 5,326,709 | 7/1994 | Moon et al. | 437/8 |

FOREIGN PATENT DOCUMENTS

| | | | |
|---|---|---|---|
| 0602271 | 2/1994 | European Pat. Off. | |
| 3937504 | 5/1990 | Germany | 437/922 |
| 0089814 | 9/1983 | Japan | 437/922 |
| 0333509 | 9/1989 | Japan | |

OTHER PUBLICATIONS

IBM Technical Disclosure Bulletin, vol. 20, No. 8, Jan. 1978, NY, U.S., pp. 3189–3190, H. Remshardt et al., "Tolerance Trimming of Electrical Data of LSI Semiconductor Circuits".

*Primary Examiner*—Jey Tsai
*Attorney, Agent, or Firm*—Theodore E. Galanthay; Lisa K. Jorgenson; Christopher F. Regan

[57] ABSTRACT

A passivation structure is formed using two passivation layers and a protective overcoat layer using two masking steps. The first passivation layer is formed over the wafer and openings are provided to expose portions of the pads for testing the device and fusible links. After testing and laser repair, a second passivation layer is formed over the wafer followed a deposit of the protective overcoat. The protective overcoat is patterned and etched, exposing the pads. The remaining portions of the protective overcoat are used as a mask to remove portions of the second passivation layer overlying the pads. Leads are then attached to pads and the devices are encapsulated for packaging. The second passivation layer overlaps edge portions of the first passivation layer at the bond pads to enhance moisture resistance.

22 Claims, 3 Drawing Sheets

DOUBLE MASK HERMETIC PASSIVATION METHOD PROVIDING ENHANCED RESISTANCE TO MOISTURE

RELATED APPLICATIONS

This application is a continuation-in-part application of U.S. patent application Ser. No. 08/738,738 filed Oct. 28, 1996, which, in turn, is a divisional application of U.S. patent application Ser. No. 08/651,618 filed May 22, 1996.

FIELD OF THE INVENTION

This invention relates in general to passivation structures, and more particularly, to double mask hermetic passivation method.

BACKGROUND OF THE INVENTION

Modern memory integrated circuits, particularly read/write circuits, such as static random access memories (SRAMs) and dynamic random access memories (DRAMs), are being quite large in physical size and in the density of memory locations therein. As the minimum feature in integrated circuit chips become smaller, the size of defect that can cause a failure shrinks accordingly. As a result, especially with large chip sizes, it is more difficult to achieve adequate manufacturing yield as the size of fatal defects diminishes. In order to reduce the vulnerability of a relatively large integrated circuit to a single, small defect, modern integrated circuits sometime utilize spare rows and columns that can replace defective rows and columns, respectively, in the memory portion of the circuit. Substitution of one of the spare rows or columns is conventionally accomplished by the opening of linking structures, such as fusible links, in decoder circuitry, so that access is made to the spare row or column upon receipt of the address for the defective row or column in the primary memory array. Conventional fuses include polysilicon fuses, which can be opened by a laser beam. Avalanche-type fuses and anti-fuses may also be used to provide the proper connections.

Examples of memory devices incorporating conventional redundancy schemes are described in Hardy, et al., "A Fault Tolerant 33ONS/375 mW 16KX1 NMOS Static RAM, *J. Solid State Circuits*, Vol. SC-16, No. 5 (IEEE, 1981), pp. 435–43, and Childs, et al., "An 1818NS 4KX4 CMOS SRAM", *J. Solid State Circuits*, Vol. SC-19, No. 5 (IEEE, 1984), pp. 545–51. An example of a conventional redundancy decoder is described in U.S. Pat. No. 4,573,146, issued Feb. 25, 1986, assigned to SGS-Thomson Microelectronics, Inc., and incorporated herein by this reference. Further a column redundancy architecture for read/write memory is described in U.S. Pat. No. 5,257,229, issued Oct. 26, 1993, assigned to SGS-Thomson Microelectronics, Inc., and incorporated herein by this reference.

In the past, three different techniques have been used primarily to form the passivation structure which protects the integrated circuit prior to encapsulation for packaging. The most secure structure uses three layers—one layer to protect the integrated circuit during testing and repair, a second layer to cover the openings formed by laser disconnect, and a third layer as a protective overcoat. This structure provides a complete hermetic sealing of the device, but is the most expensive alternative because it requires three masking levels, one associated with each of the three passivation layers.

In order to reduce the cost of the passivation structure, some manufacturers have eliminated the second passivation layer from the structure described above. While this reduces the process to two masking levels, openings formed by the laser disconnect become points of possible moisture (with mobil ion) entry as the openings are covered only by the protective overcoat, typically a polyimide. Since there is no hermetic seal, moisture can enter and contaminate the underlying integrated circuit.

A third alternative is to eliminate the masking of the integrated circuit with the first passivation layer, such that the entire surface of the integrated circuit is exposed during the test for identifying the defective rows and columns. Using this method, the testing and laser disconnect steps are performed without the benefit of a protective film covering the majoring of the integrated circuit, thereby subjecting the integrated circuit to contamination during this phase.

Therefore, a need has arisen in the industry for a process of providing a passivation structure which protects the integrated circuit at all times, but uses fewer masking steps.

SUMMARY OF THE INVENTION

In the present invention, a passivation structure is created over an integrated circuit by forming a first passivation layer over the integrated circuit and removing portions of the first passivation layer to expose pads and fusible links of the integrated circuit. After testing the integrated circuit and disconnecting one or more of the fusible links, a second passivation structure is formed over the surface of the integrated circuit and a protective overcoat is formed over the second passivation layer. Portions of the protective overcoat adjacent the pads are removed, thereby exposing portions of the second passivation layer. The exposed portions of the second passivation layer are removed using the protective overcoat as a mask. The protective overcoat may preferably be patterned so that portions on the second passivation structure overlap and seal the edge portions of the first passivation layer at the bond pads. In one embodiment, the second passivation layer is a nitride and the first passivation layer is PSG. Accordingly, the nitride layer overlaps the PSG layer edge to significantly reduce a tendency of moisture to wick between the nitride and PSG layers, such as may occur if there was no overlap.

The present invention provides other significant advantages over the prior art. Importantly, the masking levels associated with the passivation structure are reduced over the prior art, without affecting the reliability of the devices.

BRIEF DESCRIPTION OF THE DRAWINGS

For a more complete understand of the present invention, and the advantages thereof, reference is now made to the following descriptions taken in conjunction with the accompanying drawings, in which.

DETAILED DESCRIPTION OF THE PREFERRED EMBODIMENTS

Figure 1A:
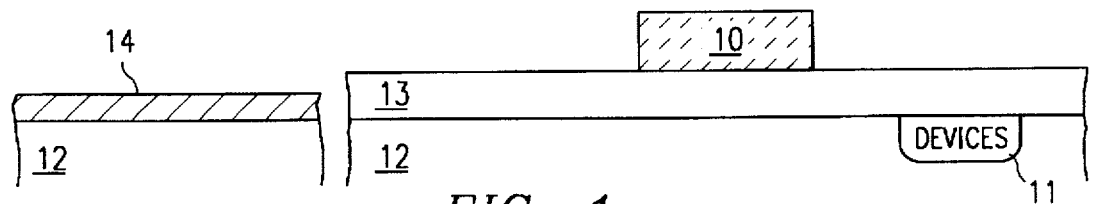
FIGS. 1a–1e illustrate cross-sectional sideviews of a prior art passivation structure at first, second, third, fourth and fifth stages, respectively, using two passivation layers and a protective overcoat.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

FIGS. 1a–e illustrate five stages of the formation of a prior art passivation structure which uses two passivation layers, one formed prior to testing and one formed after laser repair, and a protective overcoat. This prior art structure requires three masking levels to form the passivation structure.

In illustrating formation of the passivation structure, steps of forming the devices on the integrated circuit are not shown. Devices (shown generally at block 11) are formed at the surface of substrate 12 using well-known techniques. One or more interconnect layers (shown generally at layer 13) are formed to connect the devices as desired. In the initial stage shown in FIG. 1a, a metal pad 10 (generally part of one of the interconnect layers 13) is provided as a connection to the circuitry formed on the surface of the substrate 12. A polysilicon gate 14 is formed above the substrate 12 for use as a fusible like. Although not shown to scale for illustration purposes, the polysilicon gate 14 is typically formed at a level below pad 10.

Figure 1B:
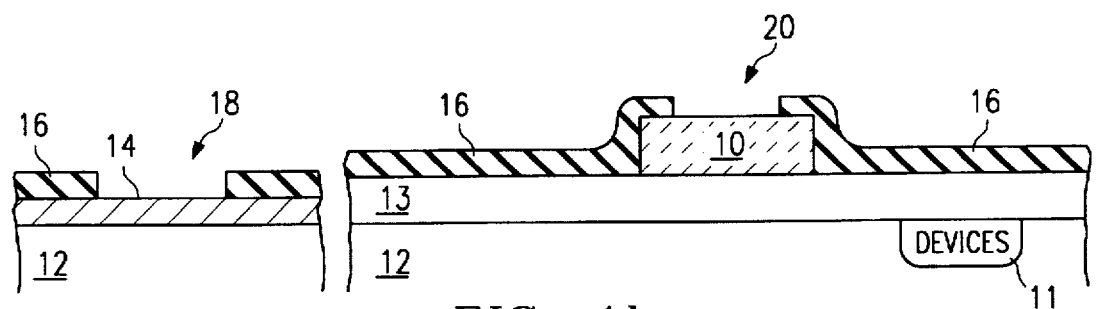

In FIG. 1b, a first passivation layer 16 is formed over the surface of the wafer. The first passivation layer 16 is etched to provide an opening 18 to the polysilicon gate 14 and an opening 20 over the pad 10. Preferably, a dielectric layer (not shown) having a thickness of 2000–8000 Angstroms is left over the polysilicon gate 14 to assist the laser repair step described below in connection with FIG. 1c. The first passivation layer 16 may be formed, for example, by deposit of a dielectric film followed by pattern and etching to form the openings 18 and 20. The pattern and etch is the first masking step used in this process to form the passivation structure. While FIG. 1a shows a single gate 14 and pad 10, it should be noted that there are a plurality of gates 14 and pads 10 formed over the integrated circuit.

Figure 1C:
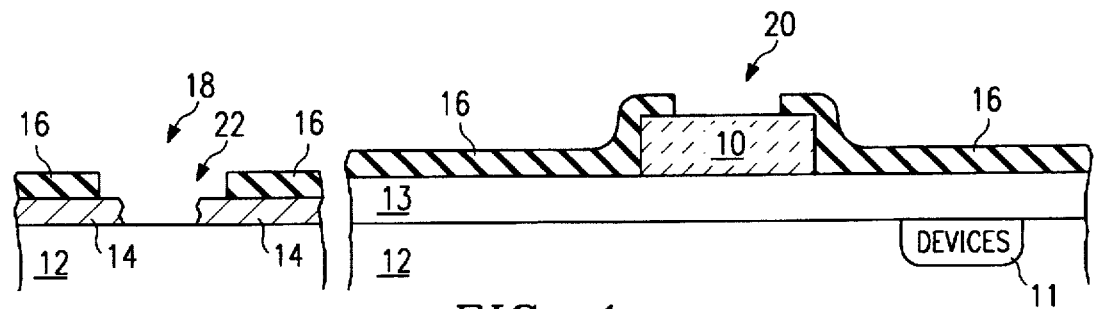

After etching to form the openings 18 and 20, the integrated circuit may be tested by probing the circuit at the pad 10. This test will determine which rows and/or columns should be disconnected to form a defect-free circuit. Once the proper rows and/or columns are detected, the associated polysilicon gates 14 are vaporized using a laser. FIG. 1c shows a disconnected portion 22 in the polysilicon gate 14.

After the laser repair step, a second passivation layer 24 is formed over the entire surface of the wafer, thereby sealing the disconnected portion 22 in the polysilicon gate 14. This layer forms a hermetic seal over all such disconnected portions 22. The second passivation layer 24 is etched to form a window 26 over the pad 10.

The second passivation layer 24 could comprise, for example, a deposited silicon nitride layer. The silicon nitride layer could be etched using a plasma etch after a masking step to expose the pads 10. This is the second masking step used in the verification of the passivation structure.

Figure 1D:
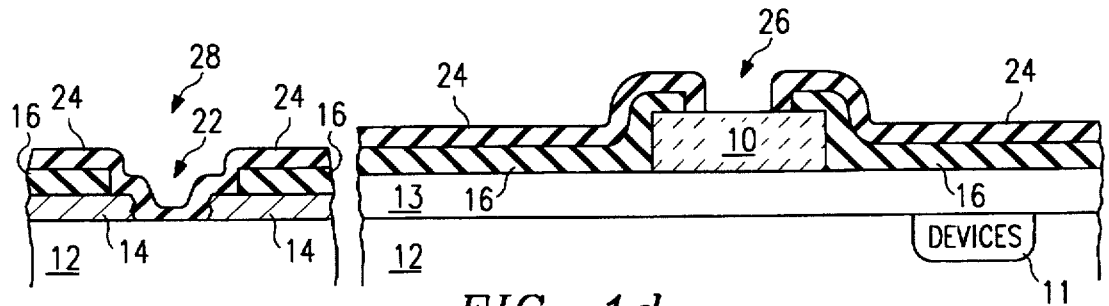
Figure 1E:
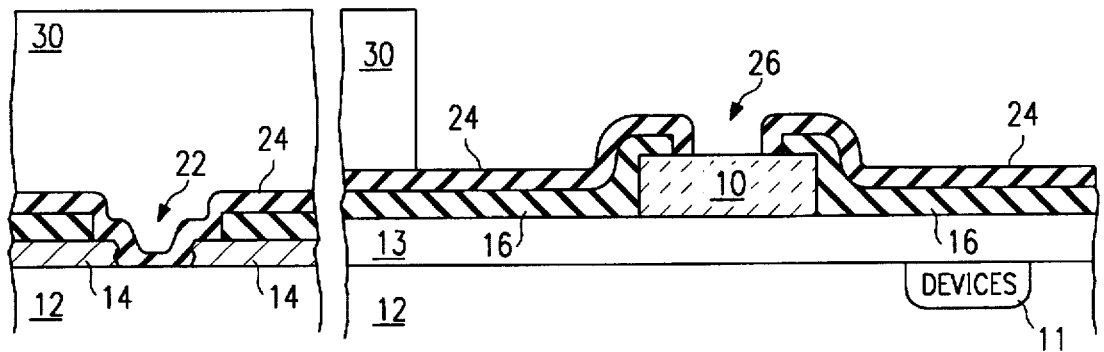

FIG. 1e illustrates a cross-sectional sideview of the passivation structure after a fifth stage wherein a protection overcoat (also referred to as a "die coat") 30 is formed over the entire wafer. The protective overcoat is patterned and etched to expose the area surrounding the pads 10. This step comprises the third masking step used in the process.

The process shown in FIGS. 1a–e is considered to be a low-risk process, since a complete hermetic seal is formed over the entire device. However, this method is expensive because of the three masking levels set forth above. In order to reduce the cost of providing the passivation structure, some manufacturers eliminate one of the two passivation layers to avoid a masking step. These structures are shown in FIGS. 2 and 3.

Figure 2:
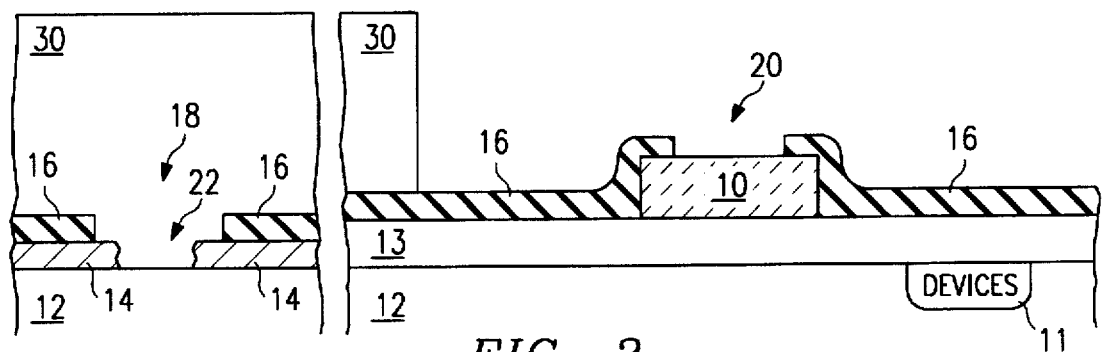
FIG. 2 illustrates a cross-sectional sideview of a prior art passivation structure using a single passivation layer formed prior to testing and a protective overcoat.

FIG. 2 illustrates a prior art structure made in the process similar to that shown in FIGS. 1a–e, except the step shown in FIG. 1d is eliminated. Consequently, the second passivation layer, which in the structure of FIGS. 1a–e covers the disconnected portions 22 of the polysilicon gate 14 after the laser repair step, is eliminated from the structure and the protective overcoat 30 fills the disconnected portions 22. While only two masking levels are used in this process, one masking level to form the openings 18 and 20 in the first passivation layer 16 and one to pattern the protective overcoat 30, the disconnected portions 22 are not hermetically sealed. Consequently, the openings are formed by laser repair in the polysilicon gate 14 are points of possible moisture entry. If polysilicon glass (PSG) is used as the first passivation layer 16, the concentration of hydroscopic phosphorus must also be limited, thereby limiting its effectiveness in short, while this structure reduces the cost of forming passivation structure, the reliability of the resulting integrated circuit is comprised.

Figure 3:
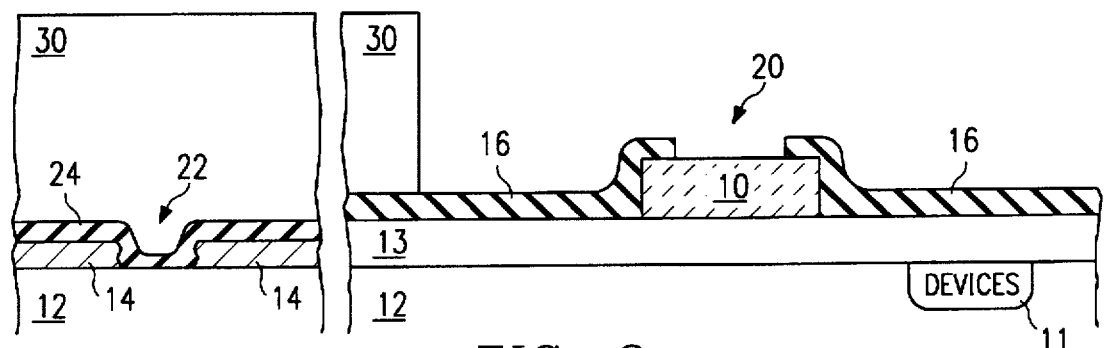
FIG. 3 illustrates a cross-sectional sideview of a prior art passivation structure using a single passivation layer formed after testing and a protective overcoat.

FIG. 3 illustrates a third prior art embodiment of forming a passivation structure in which the number of masking levels is reduced by testing the integrated circuit without the benefit of a protective layer (i.e., passivation layer 16) to protect the integrated circuit during testing. Where the testing is performed without the benefit of the protective film, yield loss can occur from a number of sources. First, if the test probes miss the pads 10 during testing, it is possible that the metal lines connected devices on the integrated circuit will be destroyed, thereby destroying the integrated circuit. Second, even when performed in a clean room environment, the device surface may be contaminated which will introduce ionic contaminants to the surface. These contaminants decrease the reliability of the device. Third, contamination in the form of particles may form shorts between metal lines of the device. Fourth, extending the exposure time of the metal lines of the device to room humidity increases the chance of aluminum corrosion.

Hence, as described hereinabove, it is clear that in order to reduce the cost of the passivation structure shown in FIG. 1e, alternative methods have compromised the reliability of the devices.

FIGS. 4a–e illustrate cross-sectional sideviews of a passivation structure after respective stages of processing in accordance with the present invention.

Figure 4A:
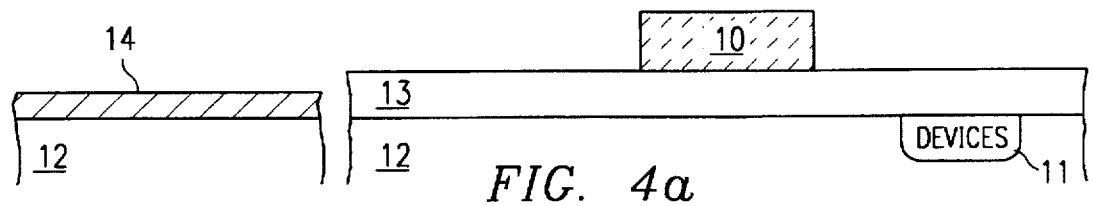
FIGS. 4a–4e illustrate cross-sectional sideviews of a passivation structure at first, second and third, fourth and fifth stages, respectively, using two passivation layers and a protective overcoat, where the passivation may be formed using two masking levels.

FIG. 4a shows an initial stage wherein the polysilicon fuse 14 and pad 10 have been formed over substrate 12. As discussed in relation to FIG. 1a, in an actual integrated circuit, multiple pads and multiple fusible links would be formed on the integrated circuit. The pads 10 are connected to the devices previously formed at the face of substrate 12. Various devices are coupled through one or more interconnect layers, typically using metal layers formed over the devices (and separated therefrom by dielectric layers) and using common bitlines and wordlines formed as part of the devices.

Figure 4B:
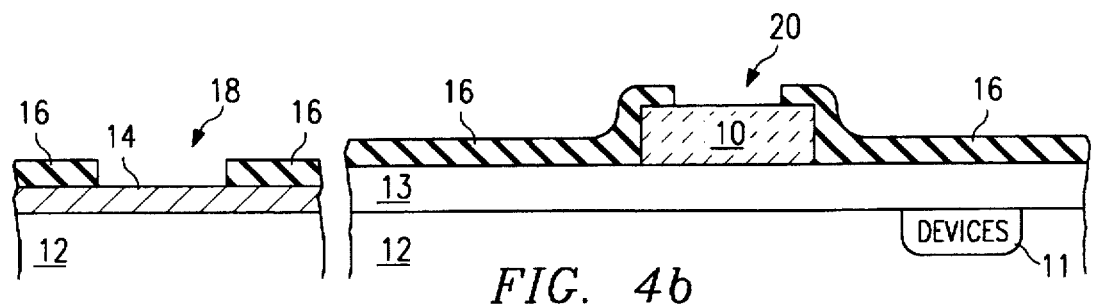
Figure 4C:
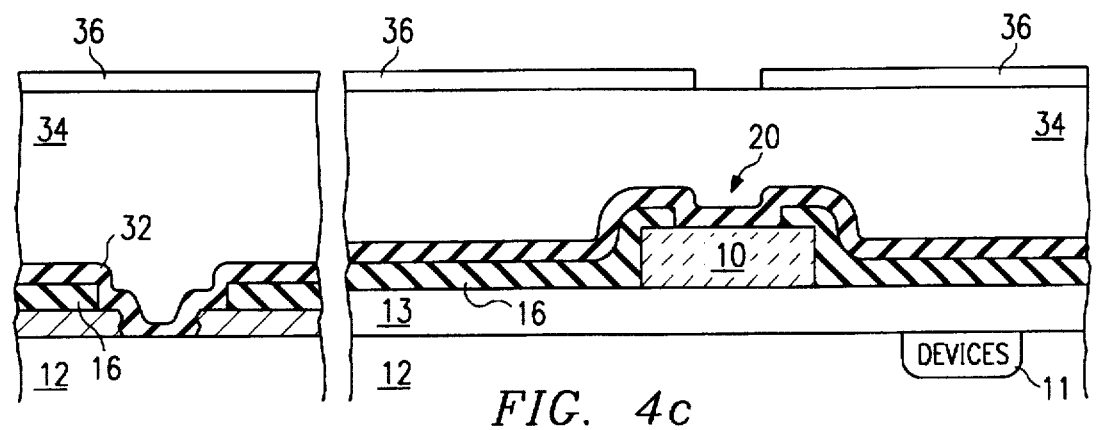

In FIG. 4b, a first passivation layer 16 is formed over the wafer and is etched to form the openings 18 and 20, as shown in connection with FIG. 1b. The first passivation layer 16 may comprise, for example, a dielectric film of approximately 2 k to 15 k Angstroms. The material for the passivation layer may be a silicon oxide, PSG, or silicon oxynitride ($Si_xO_yN_z$).

After formation of the first passivation layer 16, the devices on the wafer are tested to identify defective elements using well-known techniques. Thereafter, laser repair is performed by forming disconnected regions 22 in the polysilicon gate 14, as shown in 14, as shown in connection with FIG. 1c.

After the laser repair step, a second dielectric film 32 of approximately 200–5,000 Angstroms is deposited over the surface of the wafer. This second passivation layer 32 may comprise, for example, silicon oxide, PSG, silicon oxynitride, or silicon nitride. Typically, the second passivation layer should be a different material than the first passivation layer 16, since a selective etch will be used in a later step. Alternatively, the same material may be used for both passivation layers, and a timed etch would remove the second passivation layer 32, while leaving a sufficient thickness of the first passivation layer 16.

Unlike the prior art, the second passivation layer 32 is not patterned and masked. Instead, the protective overcoat, for example, a polyimide, 34 is formed over the entire wafer. A mask 36 is patterned over the protective overcoat layer 34 using photolithographic techniques.

Figure 4D:
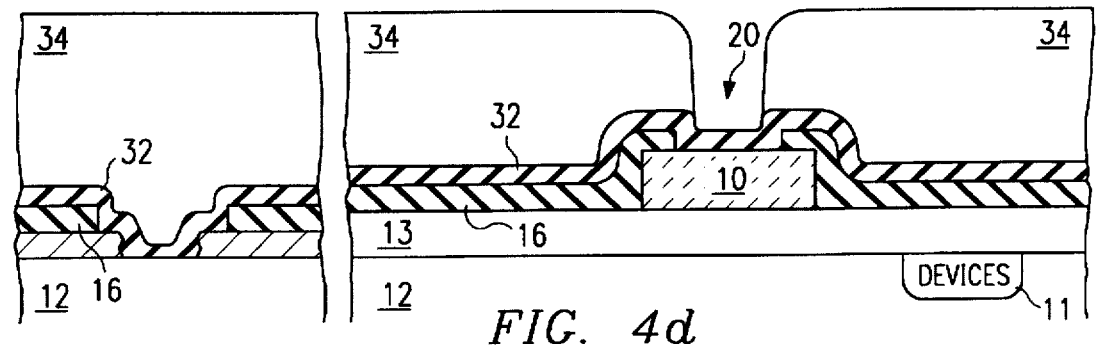

In FIG. 4d, the protective overcoat 34 is etched using an organic or other suitable etch which is selective to the second passivation layer 32. The etch removes portions of the protective overcoat adjacent the pads 10, but leaving portions of the overcoat above edges of the bond pad 10 and above edges of the first passivation layer 16 as illustrated.

Figure 4E:
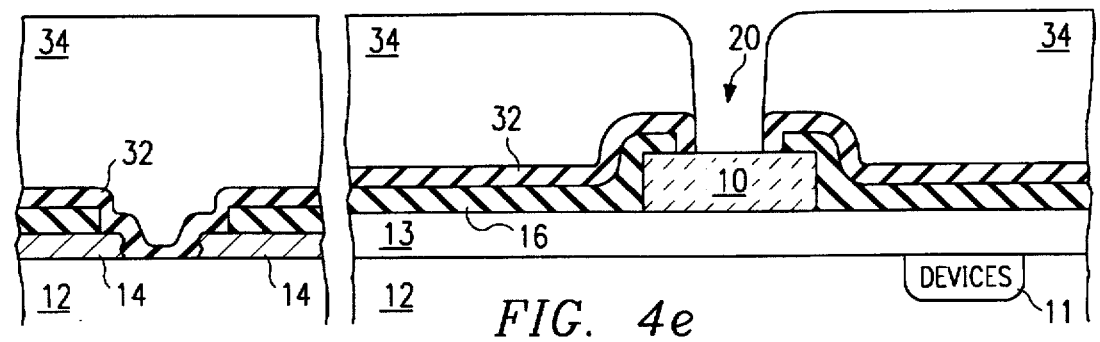

In FIG. 4e, the remaining portions of the protective overcoat 34 are used as a mask for the second passivation layer 32. Using a plasma etch, which is selective to the protective overcoat 34 and the first passivation layer 16, the portions of the second passivation layer 32 above a medial portion of the pads 10 are removed, thereby exposing the opening 20 to the pad. Thereafter, the leads can be attached to the pads 10 and the integrated circuits can be encapsulated for packaging.

As can be seen by the process steps shown above, a passivation structure is shown with complete hermetic sealing by using two passivation layers and a protective overcoat layer, performed using only two masking steps. Consequently, the cost of producing the passivation structure is reduced without affecting the reliability of the underlying devices.

In addition, the second passivation layer 32 preferably overlaps the edges of the first passivation layer 16 at the openings for the bond pads 10 as shown in FIG. 4e. Accordingly, moisture is prevented from wicking into an otherwise exposed interface between the first and second passivation layers as may otherwise occur if the second passivation layer terminated short of the bond pad and did not overlap the first passivation layer as illustrated. As would be readily understood by those skilled in the art, wicking may occur particularly between an exposed interface between PSG and nitride passivation layers. The present invention overcomes any such difficulty while still being readily manufacturable using only two masks as described herein.

Although the present invention and its advantages have been described in detail, it should be understood that various changes, substitutions and alterations can be made herein without departing from the spirit and scope of the invention as defined by the appended claims.

That which is claimed is:

1. A method of forming a passivation structure over an integrated circuit of a type comprising pads and linking structures, the method comprising the steps of:

forming a first passivation layer over the integrated circuit;

removing portions of the first passivation layer overlying the pads and linking structures of the integrated circuit so that edge portions of the first passivation layer are exposed at the pads;

testing the integrated circuit by probing the exposed pads;

altering the condition of one or more of the linking structures based upon the testing, such that one or more of the linking structures are in a disconnected state;

forming a second passivation layer over the entire surface of the integrated circuit;

without using a pattern mask and etching the second passivation layer, forming a protective overcoat over the second passivation layer;

removing portions of the protective overcoat adjacent the pads, thereby exposing portions of the second passivation layer;

removing the exposed portions of the second passivation layer, and while leaving edge portions of the second passivation layer overlapping the exposed edge portions of the first passivation layer at the pads; and retaining patterned protective overcoat on the integrated circuit after exposing and etching the second passivation layer.

2. A method of claim 1 wherein the step of removing portions of the protective overcoat comprises the steps of:

forming a mask layer over portions of the protective overcoat; and etching portions of the protective overcoat not covered by the mask layer.

3. A method of claim 2 wherein the step of forming a protective overcoat comprises forming a polyimide layer over the second passivation layer.

4. A method of claim 3 wherein the step of etching portions of the protective overcoat comprises etching portions of the protective overcoat using an organic etch process.

5. A method of claim 3 wherein the step of step of removing exposed portions of the second passivation layer comprises removing exposed portions of the second passivation layer using a plasma etch.

6. A method of claim 1 wherein the step of altering the condition one or more of the linking structures comprises disconnecting one or more fusible links.

7. A method of claim 6 wherein the step of disconnecting one or more fusible links comprises the step of vaporizing portions of one or more fusible links.

8. A method of claim 7 wherein the step of vaporizing comprises the step of vaporizing portions of one or more polysilicon gates.

9. A method of claim 1 wherein the step of forming the first passivation layer comprises forming same from one of silicon dioxide, PSG, silicon oxynitride, or silicon nitride.

10. A method of claim 1 wherein the step of forming the second passivation layer comprises forming same from one of silicon dioxide, PSG, silicon oxynitride or silicon nitride.

11. A method of claim 1 wherein the step of forming the first passivation layer comprises forming same from PSG;

and wherein the step of forming the second passivation layer comprises forming same from a nitride.

12. A method of forming an integrated circuit comprising the steps of:

forming devices in a substrate;

forming pads overlying the substrate;

forming linking structures for selectively linking devices;

forming interconnects coupling ones of the devices and pads;

forming a first passivation layer over the devices, pads, linking structures and interconnects;

removing portions of the first passivation layer overlying the pads and linking structures of the integrated circuit so that edge portions of the first passivation layer are exposed at the pads;

testing the integrated circuit by probing the exposed pads;

altering the condition of one or more of the linking structures based upon the testing, such that one or more of the linking structures are in a disconnected state;

forming a second passivation layer over the entire surface of the integrated circuit;

without using a pattern mask and etching the second passivation layer, forming a protective overcoat over the second passivation layer;

removing portions of the protective overcoat adjacent the pads, thereby exposing portions of the second passivation layer;

removing the exposed portions of the second passivation layer, and while leaving edge portions of the second passivation layer overlapping the exposed edge portions of the first passivation layer at the pads; and retaining patterned protective overcoat on the integrated circuit after exposing and etching the second passivation layer.

13. A method of claim 12 wherein the step of removing portions of the protective overcoat comprises the steps of:

forming a mask layer over portions of the protective overcoat; and etching portions of the protective overcoat not covered by the mask layer.

14. A method of claim 13 wherein the step of forming a protective overcoat comprises forming a polyimide layer over the second passivation layer.

15. A method of claim 14 wherein the step of etching portions of the protective overcoat comprises etching portions of the protective overcoat using an organic etch process.

16. A method of claim 14 wherein the step of step of removing exposed portions of the second passivation layer comprises removing exposed portions of the second passivation layer using a plasma etch.

17. A method of claim 12 wherein the step of altering the condition one or more of the linking structures comprises disconnecting one or more fusible links.

18. A method of claim 17 wherein the step of disconnecting one or more fusible links comprises the step of vaporizing portions of one or more fusible links.

19. A method of claim 18 wherein the step of vaporizing comprises the step of vaporizing portions of one or more polysilicon gates.

20. A method of claim 19 wherein the step of forming the first passivation layer comprises forming same from one of silicon dioxide, PSG, silicon oxynitride, or silicon nitride.

21. A method of claim 12 wherein the step of forming the second passivation layer comprises forming same from one of silicon dioxide, PSG, silicon oxynitride or silicon nitride.

22. A method of claim 12 wherein the step of forming the first passivation layer comprises forming same from PSG; and wherein the step of forming the second passivation layer comprises forming same from a nitride.

* * * * *